United States Patent [19]

Tondryk

[11] Patent Number: 5,243,301
[45] Date of Patent: Sep. 7, 1993

[54] MICROWAVE POWER AMPLIFIERS

[75] Inventor: Wieslaw J. Tondryk, London, United Kingdom

[73] Assignee: Matra Marconi Space UK Limited, Stanmore, United Kingdom

[21] Appl. No.: 910,907

[22] Filed: Jul. 10, 1992

[30] Foreign Application Priority Data

Jul. 23, 1991 [GB] United Kingdom ............... 9115926

[51] Int. Cl.$^5$ .............................................. H03F 3/19
[52] U.S. Cl. ..................................... 330/296; 330/286
[58] Field of Search ............................ 330/286, 296

[56] References Cited

U.S. PATENT DOCUMENTS

| | | |
|---|---|---|
| 3,513,406 | 5/1970 | Leuthauser. |
| 3,525,050 | 8/1970 | Wolf et al. . |
| 3,708,756 | 2/1973 | Fajen. |
| 3,984,783 | 10/1976 | Bickley. |
| 4,387,346 | 6/1983 | Fackler ............... 330/296 |

FOREIGN PATENT DOCUMENTS

| | | |
|---|---|---|
| 0033198 | 8/1981 | European Pat. Off. . |
| 0080209 | 6/1983 | European Pat. Off. . |
| 3020313 | 12/1981 | Fed. Rep. of Germany. |

Primary Examiner—James B. Mullins
Attorney, Agent, or Firm—Spencer, Frank & Schneider

[57] ABSTRACT

A microwave power amplifier having application in multiple beam phased antenna array systems including a biasing means connection to the base of a microwave transistor being responsive to radio frequency signals applied to the amplifier to automatically adjust the transistor bias level to maintain constant amplifier gain. The biasing means includes two voltage regulators with their outputs capacitively coupled via a fixed resistor having a value determined by the characteristics of the transistor, the base of the transistor being connected to the biasing means at the junction of the resistor and the capacitive coupling of one of the regulators. The mode of operation of the power amplifier gives rise to a highly efficient linear system while under effective Class B (non-linear) bias.

4 Claims, 1 Drawing Sheet

MICROWAVE POWER AMPLIFIERS

BACKGROUND OF THE INVENTION

The invention relates to microwave power amplifiers and, in particular, L-Band microwave transistor power amplifiers with a dynamically efficient biasing arrangement and having application in multiple beam phased antenna arrays.

In an active multiple beam phased antenna array system each antenna element (or elemental sub-array) is driven by a dedicated power amplifier. A requirement of such a system is that the power can be flexibly reallocated between different beams and that the power amplifiers have to be capable of operation over a wide dynamic range whilst simultaneously maintaining a very high degree of gain and phase tracking.

In order to maintain reasonable high levels of efficiency in phase array systems it is necessary to operate amplifiers in their non-linear regions. Additionally, to provide for a wide signal dynamic (20 dB minimum) the most efficient bias modes (Class B or C) are not normally contemplated, instead the designer resorts to "overrun" Class A amplifiers (Class A/B).

It is an object of the present invention to provide a power amplifier with dynamically efficient biasing and capable of linear operation whilst under effective Class B (non-linear) bias.

SUMMARY OF THE INVENTION

The invention provides a microwave power amplifier including a microwave transistor and transistor biasing means connected to the base of the transistor and responsive to radio frequency signals applied to the amplifier to automatically adjust the transistor bias level to maintain constant amplifier gain, the biasing means including first and second capacitively coupled voltage regulators, the base of the transistor being connected to the first regulator via a fixed resistor and a first section of the capacitive coupling and to the second regulator via voltage switching means and a second section of the capactive coupling.

BRIEF DESCRIPTION OF THE DRAWINGS

The foregoing and other features according to the present invention will be better understood from the following description with reference to the accompanying drawings in which.

DESCRIPTION OF THE PREFERRED EMBODIMENT

The principle of operation of the microwave power amplifier according to the present invention is that the biasing of the amplifier's microwave transistor is automatically adjusted by the incident radio frequency (rf) power level in order to keep the gain of the amplifier constant. This mode of operation, i.e., a dynamically variable transistor biasing arrangement, gives rise to a highly efficient and linear system.

Figure 1:
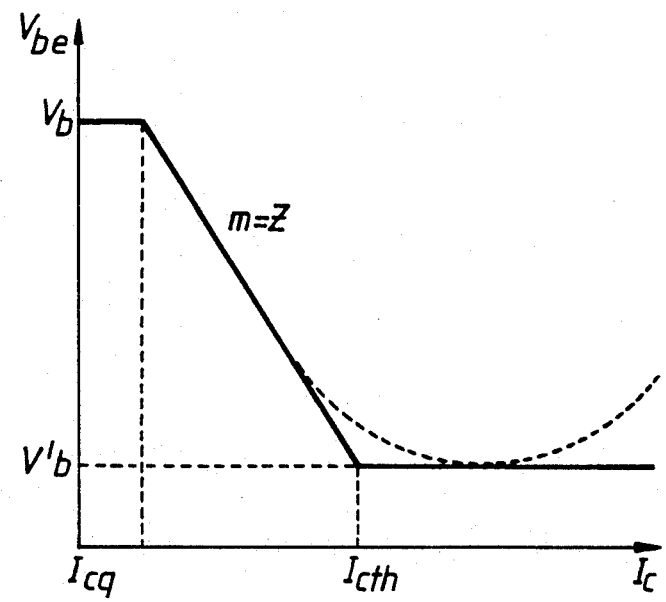
FIG. 1 illustrates the $V_{be}$ versus $I_c$ characteristics for a microwave power amplifier according to the present invention.

The bias levels in terms of the transistor base/emitter voltage, $V_{be}$, and the transistor collector current, $I_c$, necessary to produce a constant gain function over a dynamic range of approximately 20dB are illustrated in FIG. 1 of the drawings. The collector current, $I_c$, is a function of both the base emitter forward bias and the rf input drive level.

As shown in FIG. 1, the slope of the $V_{be}$ versus $I_c$ characteristics is linear at lower drive levels followed by an inflection which is approximated by a plateau region shown dotted.

The necessary $V_{be}$ versus $I_c$ characteristics for constant gain illustrated in FIG. 1 can be readily transposed to a base current, $I_b$, instead of collector current, $I_c$, relationship. In so doing, it is clearly evident that the linear sloping region corresponds to a $V_{be}$ source of finite output impedance, determined by that slope, and the idealised flat region to zero impedance.

Figure 2:
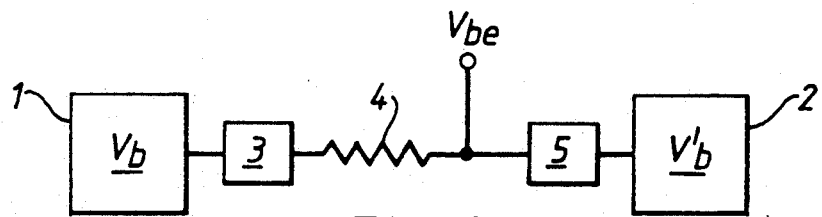
FIG. 2 illustrates a simple circuit topology for a microwave power amplifier according to the present invention.

The simplest circuit topology for a power amplifier that is capable of realising such a function in a controllable manner is illustrated in FIG. 2 of the drawings.

As shown in FIG. 2, the topology consists of two identical regulators 1 and 2 with their outputs connected via capacitor decoupling means 3, a resistor 4 and capacitor decoupling means 5; the resistor 4 being of a value determined from the $V_{be}$ versus $I_c$ characteristics illustrated in FIG. 1. The base of the microwave transistor, as depicted in FIG. 2 by the base/emitter voltage, $V_{be}$, is connected to the regulator 2 via the capacitor decoupling means 5 and via the resistor 4 and capacitor decoupling means 3 to the regulator 1.

The quiescent point of the power amplifier ($V_b$; $I_c$) is set by the regulator 1 and the regulator 2 is set to a voltage $V'_b$, corresponding to the plateau "knee" illustrated in FIG. 1.

In operation of the power amplifier, as the rf drive is increased more base current is drawn and hence the voltage $V_b$ of regulator 1 drops in linear proportion until it reaches the preset level of regulator 2. Since both circuits can only source and not sink current the regulator 2 drops in while the regulator 1 drops out, the transition between these two states being quite smooth as is the desired function.

Figure 3:
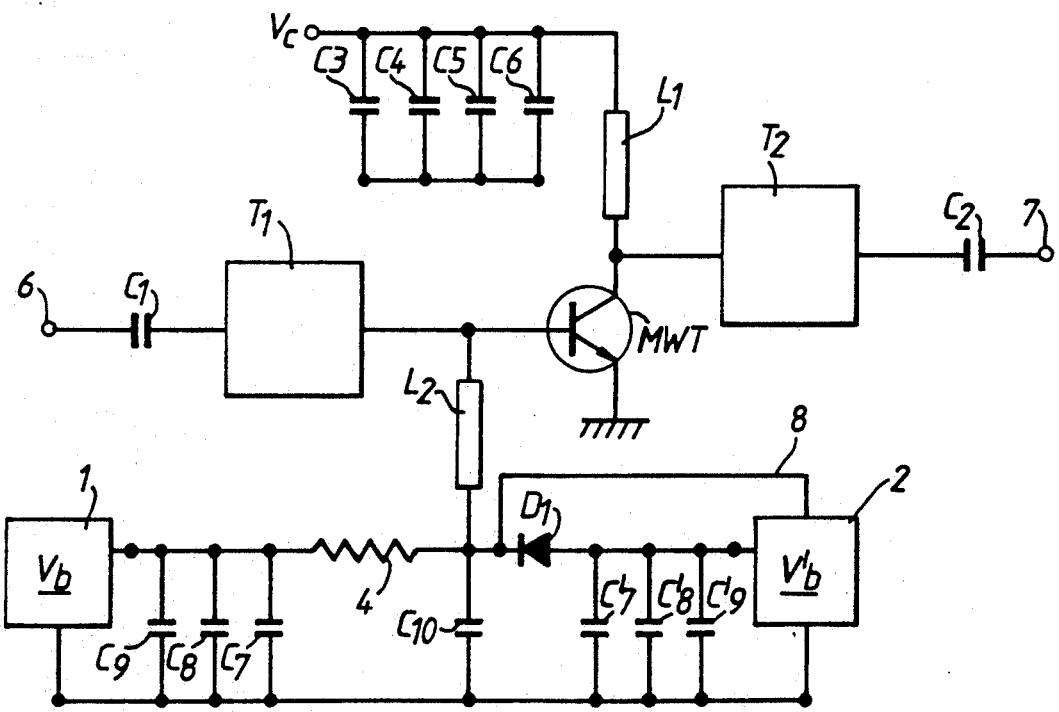
FIG. 3 illustrates a circuit diagram for a microwave power amplifier according to the present invention.

The rf circuit and the associated major biasing components for a power amplifier according to the present invention is illustrated in FIG. 3 of the drawings.

As shown in FIG. 3, the emitter of a microwave transistor MWT, for example, a bipolar transistor, is connected to earth, the base of the transistor MWT is connected to an r.f. input terminal 6 via an input matching transformer T1 and a capacitor C1 and the collector of the transistor MWT is connected to an r.f. output terminal 7 via an output matching transformer T2 and a capacitor C2 and to a collector voltage source, $V_c$, via a ¼ wavelength ($\lambda/4$) bias line L1 and a parallel bank of capacitors, C3 to C6.

The voltage regulators 1 and 2 and the resistor 4 of FIG. 2 are given the same reference numbers in FIG. 3 and the capacitor decoupling means 3 and 5 of FIG. 2 are respectively shown in FIG. 3 as parallel banks of capacitors, C7 to C9 and C'7 to C'9.

The output of the voltage regulator 2 is connected via the parallel bank of capacitors C'7 to C'9, a solid state diode switch D1 and the bias line L2 to the base of the transistor MWT. A capacitor C10 is connected in parallel with the capacitor banks C7 to C9 and C'7 to C'9 between one side of each of the regulators 1 and 2 and the junction of the resistor 4, line L2 and diode D1.

As shown in FIG. 3 bias is applied to the base of the transistor MWT via the line L2 which is r.f. short circuited by the capacitor C10 thereby forming a high impedance at the r.f. centre frequency (1.54 GHz in this case). At intermediate frequencies (beat frequencies in the case of a multi-tone input signal) the bias line is effectively low impedance such that the capacitor banks, C7 to C9 and C'7 to C'9, and the resistor 4 are in the current path from the bias source to the base of the transistor MWT. The linearising action of the resistor 4 is therefore effective at these frequencies.

Selection of the values for the capacitors C7 to C9 is of paramount importance to ensure adequate decoupling and hence maintain a flat "modulation bandwidth" within the amplifier.

At high r.f. input signal levels, when the bias source $V'_b$ comes into operation, the decoupling provided by the capacitor bank, C7 to C9, is insufficient due to the blocking resistor 4 hence the inclusion of the capacitor bank C'7 to C'9 in direct line with the voltage ($V'_b$) regulator 2. When regulator 2 is not operational at low drive levels, diode switch D1 acts to prevent the capacitor bank C'7 to C'9 from nullifying the linearising effect of the resistor 4. If this is not effected, then the resistor 4 would only be in circuit at very low intermediate frequencies.

The switching action of the diode D1 is controlled by including it in the feed-back sense loop 8 of the regulator 2.

The actual number and values of the capacitors in each of the parallel banks which form the capacitor decoupling means 3 and 5 is not material save for the fact that the capacitor filter network is required to maintain adequate performance for the application and that this has to be duplicated via an r.f. switch in order for the circuit to function correctly at all power levels.

The value of the resistor 4 is matched to the transistor MWT and is directly proportional to the devices hfe. Its value is typically in the range 5 to 40 ohms.

The advantage of the microwave power amplifier according to the present invention is that it uses two simple fixed regulators, capacitor decoupling means and a fixed resistor to produce linear operation while under effective Class B (non-linear) bias. Furthermore, the simple clamping action of one of the regulators negates the need for a variable resistor and ensures that there is no deterioration in performance at high r.f. drive levels.

The main application of the microwave power amplifier according to the present invention is in multiple beam phased antenna array systems wherein each antenna element (or elemental sub-array) is driven by a dedicated power amplifier and, in particular, L-Band microwave transistor power amplifiers.

What is claimed is:

1. A microwave power amplifier including a microwave transistor having a collector, an emitter and a base; and transistor biasing means connected to the base of the transistor and responsive to radio frequency signals applied to the amplifier to automatically adjust the bias level of the transistor to maintain constant amplifier gain, the biasing means including first and second voltage regulators;

capacitive coupling means for the regulators, said capacitive coupling means having first and second sections;

a fixed resistor connected at one end thereof to the base of the transistor and at the other end thereof to the first voltage regulator via the first section of the capacitive coupling means; and voltage switching means connecting the second voltage regulator to the base of the transistor via the second section of the capacitive coupling means.

2. A microwave power amplifier as claimed in claim 1 wherein the voltage switching means is a solid state diode and is included in a feed-back sensing loop of the second voltage regulator.

3. A microwave power amplifier as claimed in claim 1 wherein the value of the resistor is matched to the base emitter voltage versus collector current characteristics of the transistor and is directly proportional to the devices hfe.

4. A microwave power amplifier as claimed in claim 3 wherein the value of the resistor is in the range 5 to 40 ohms.

* * * * *